US008823019B2

(12) United States Patent
Kim et al.

(10) Patent No.: US 8,823,019 B2
(45) Date of Patent: Sep. 2, 2014

(54) WHITE ORGANIC LIGHT EMITTING DEVICE AND DISPLAY DEVICE USING THE SAME

(75) Inventors: Hwa-Kyung Kim, Gyeonggi-do (KR);
Byung-Chul Ahn, Seoul (KR);
Chang-Wook Han, Seoul (KR);
Hong-Seok Choi, Seoul (KR);
Sung-Hoon Pieh, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/329,488

(22) Filed: Dec. 19, 2011

(65) Prior Publication Data

US 2012/0161114 A1    Jun. 28, 2012

(30) Foreign Application Priority Data

Dec. 28, 2010  (KR) .................. 10-2010-0136491

(51) Int. Cl.
*H01L 27/15*  (2006.01)
*H01L 27/32*  (2006.01)

(52) U.S. Cl.
CPC ..... *H01L 27/3209* (2013.01); *H01L 2251/5376* (2013.01); *H01L 27/322* (2013.01); *H01L 27/3244* (2013.01)
USPC .............................................. 257/79; 438/22

(58) Field of Classification Search
CPC  C09K 11/06; H01L 51/5012; H01L 51/5036; H01L 33/502
USPC ................ 257/79–103, E51.022–E51.026; 313/498–512, 463, 467
See application file for complete search history.

(56) References Cited

U.S. PATENT DOCUMENTS

| 2002/0027416 A1* | 3/2002 | Kim et al. ...................... 313/506 |
| 2010/0053043 A1* | 3/2010 | Sakamoto ........................ 345/77 |
| 2010/0133522 A1* | 6/2010 | Pieh et al. ........................ 257/40 |
| 2010/0314636 A1* | 12/2010 | Matsunami et al. ........... 257/88 |
| 2011/0156059 A1 | 6/2011 | Reineke et al. |

FOREIGN PATENT DOCUMENTS

| CN | 101170852 A | 4/2008 |
| CN | 101641795 A | 2/2010 |
| CN | 101752509 A | 8/2010 |

(Continued)

OTHER PUBLICATIONS

First Notification of Office Action dated Jan. 15, 2014 from The State Intellectual Property Office of China in counterpart Chinese application No. 201110433435.1.

(Continued)

*Primary Examiner* — Jae Lee
*Assistant Examiner* — Junaiden Mirsalahuddin
(74) *Attorney, Agent, or Firm* — Morgan, Lewis & Bockius LLP

(57) ABSTRACT

A white organic light emitting device and a display device using the same to which a 2-peak spectrum is applied to execute white display comprises a first electrode and a second electrode disposed opposite each other on a substrate, and a blue light emitting unit and a phosphorescent light emitting unit provided between the first electrode and the second electrode, and a 2-peak white spectrum is formed through a first light emitting peak of the blue light emitting unit at a wavelength of 430 nm to 460 nm and a second light emitting peak of the phosphorescent light emitting unit at a wavelength of 530 nm to 630 nm.

15 Claims, 7 Drawing Sheets

(56) References Cited

FOREIGN PATENT DOCUMENTS

| | | |
|---|---|---|
| JP | 2004-281274 A | 7/2004 |
| KR | 1020100086509 A | 3/2010 |
| KR | 1020100062169 A | 10/2010 |
| WO | 2008/131750 A2 | 11/2008 |

OTHER PUBLICATIONS

Office Action dated Feb. 11, 2014 from the Korean Patent Office in counterpart Korean application No. 10-2010-0136491.

Office Action dated Apr. 30, 2013 from the German Patent and Trademark Office in counterpart German application No. 10 2011 056 448.9.

\* cited by examiner

WHITE ORGANIC LIGHT EMITTING DEVICE AND DISPLAY DEVICE USING THE SAME

This application claims the benefit of Korean Patent Application No. P 10-2010-0136491, filed on Dec. 28, 2010, which is hereby incorporated by reference as if fully set forth herein.

BACKGROUND OF THE INVENTION

1. Field of the Invention

The present invention relates to an organic light emitting device, and more particularly, to a white organic light emitting device and a display device using the same to which a 2-peak spectrum is applied to execute white display.

2. Discussion of the Related Art

Recently, as the information age has arrived in earnest, a display field to visually express electric information signals has rapidly developed. In order to satisfy such a trend, various flat display devices having excellent performance, such as a thin profile, a light weight, and low power consumption, have been developed and have quickly replaced conventional cathode ray tubes.

As examples of the flat display devices, there are liquid crystal displays (LCDs), plasma display panels (PDPs), field emission displays (FEDs), and organic light emitting devices (OLEDs).

Among the above flat display devices, organic light emitting devices are considered as a competitive application to achieve compactness and clear color display of the devices without a separate light source.

These organic light emitting devices essentially require formation of an organic light emitting layer, and a deposition method using a shadow mask has been conventionally used to form the organic light emitting layer.

However, if the shadow mask has a large area, the shadow mask sags due to load thereof and thus it is difficult to use the shadow mask several times, and an error may occur during formation of an organic light emitting layer pattern. Therefore, methods to solve these problems are required.

As one of several methods substituted for the shadow mask, a white organic light emitting display device is used.

Hereinafter, the white organic light emitting display device will be described.

The white organic light emitting display device is formed by depositing respective layers between a cathode and an anode without a mask during formation of light emitting diodes. Here, organic films, such as an organic light emitting layer, having different components are sequentially deposited in a vacuum state.

The white organic light emitting display device is used for various purposes, e.g., as a thin light source, a backlight of a liquid crystal display device, and a full color display device employing color filters.

In general, a spectrum applied to the white organic light emitting display device generally has 3 peaks or more such that respective peaks are generated at R, G and B regions to achieve color implementation. The reason for this is to relatively facilitate RGB color implementation of light transmitted through a light emitting layer after transmission through a color filter layer.

As a structure of the white organic light emitting display device, a 2 tandem structure including a blue light emitting unit and a red-green light emitting unit is well known. However, it is not easy to simultaneously emit red light and green light from the red-green light emitting unit, and to reproductively obtain light intensities of corresponding peaks of the red light and the green light during a process.

SUMMARY OF THE INVENTION

Accordingly, the present invention is directed to a white organic light emitting device and a display device using the same that substantially obviate one or more problems due to limitations and disadvantages of the related art.

One of the objects of the present invention is to provide a white organic light emitting device and a display device using the same to which a 2-peak spectrum is applied to execute white display.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a white organic light emitting device a first electrode and a second electrode disposed opposite each other on a substrate, and a blue light emitting unit and a phosphorescent light emitting unit provided between the first electrode and the second electrode, wherein a 2-peak white spectrum is formed through a first light emitting peak of the blue light emitting unit and a second light emitting peak of the phosphorescent light emitting unit.

Here, the blue light emitting unit may include a blue light emitting layer having the first light emitting peak at a wavelength of 380 nm to 479 nm, and the phosphorescent light emitting unit may include a phosphorescent light emitting layer having the second light emitting peak at a wavelength of 480 nm to 780 nm.

The blue light emitting layer may be formed by doping at least one host with a blue dopant.

The phosphorescent light emitting layer may be formed by doping at least one host with a greenish yellow dopant, or by doping at least one host with a yellow dopant.

The first light emitting peak of the blue light emitting layer may be in the range of a wavelength of 430 nm to 460 nm, and the second light emitting peak of the phosphorescent light emitting layer may be in the range of a wavelength of 530 nm to 630 nm. Further, a trough of the 2-peak white spectrum between the first light emitting peak and the second light emitting peak may be at a wavelength of 480 nm to 530 nm.

Further, the maximum peak of the 2-peak white spectrum may be generated at a wavelength corresponding to the first light emitting peak.

The white organic light emitting unit may further include a charge generation layer provided between the blue light emitting unit and the phosphorescent light emitting unit.

The white organic light emitting unit may further include first to third common layers sequentially provided between the first electrode and the blue light emitting unit, between the blue light emitting unit and the phosphorescent light emitting unit and between the phosphorescent light emitting unit and the second electrode.

In another aspect of the present invention, a display device includes a substrate on which a cell drive unit is formed, a first electrode connected to the cell drive unit, a second electrode disposed opposite to the first electrode, a charge generation layer provided between the first electrode and the second electrode, a blue light emitting unit provided between the first electrode and the charge generation layer and having a first light emitting peak, and a phosphorescent light emitting unit provided between the charge generation layer and the second electrode and having a second light emitting peak.

The blue light emitting unit may include a blue light emitting layer having the first light emitting peak at a wavelength of 380 nm to 479 nm, and the phosphorescent light emitting unit may include a phosphorescent light emitting layer having the second light emitting peak at a wavelength of 480 nm to 780 nm.

The display device may further include first to fourth common layers sequentially provided between the first electrode and the blue light emitting unit, between the blue light emitting unit and the charge generation layer, between the charge generation layer and the phosphorescent light emitting unit and between the phosphorescent light emitting unit and the second electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
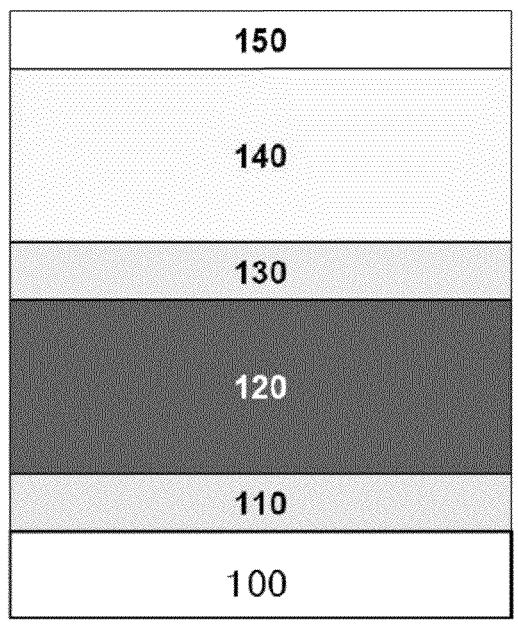
FIG. 1 is a sectional view illustrating a white organic light emitting device in accordance with the present invention.

Hereinafter, with reference to the accompanying drawings, a white organic light emitting device in accordance with one embodiment of the present invention will be described in detail.

Reference will now be made in detail to the preferred embodiments of the present invention, examples of which are illustrated in the accompanying drawings. Wherever possible, the same reference numbers will be used throughout the drawings to refer to the same or like parts. In the drawings, the thicknesses or sizes of respective layers and regions may be exaggerated for convenience and clarity of description.

Figure 2:
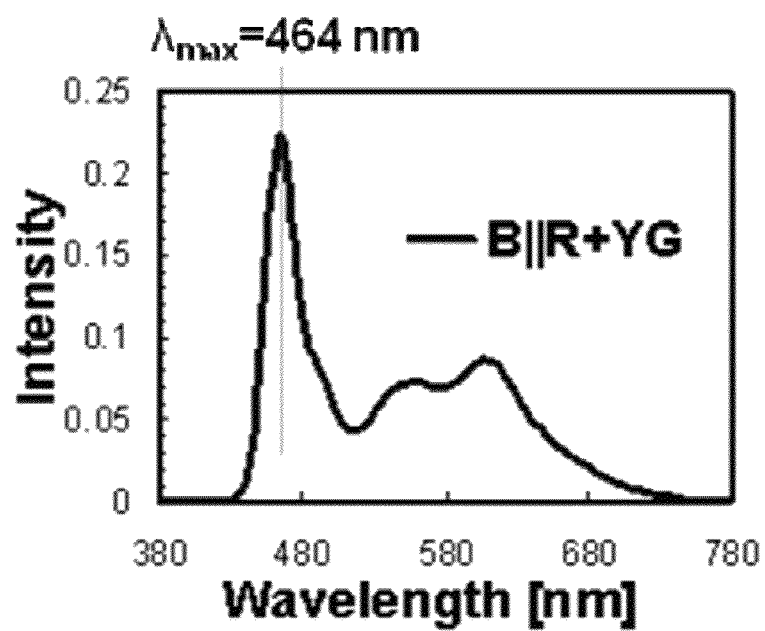
FIG. 2 is a graph illustrating light intensities according to wavelength of FIG. 1.

FIG. 1 is a sectional view illustrating a white organic light emitting device in accordance with the present invention, and FIG. 2 is a graph illustrating light intensities according to wavelength of FIG. 1.

The white organic light emitting device in accordance with the present invention includes a first electrode 110 and a second electrode 150 disposed opposite each other on a substrate 100, and a blue light emitting unit 120 and a phosphorescent light emitting unit 140 provided between the first electrode 110 and the second electrode 150, and has a 2-peak white spectrum through a first light emitting peak P1 of the blue light emitting unit 120 and a second light emitting peak P2 of the phosphorescent light emitting unit 140.

Further, the white organic light emitting device may further include a charge generation layer (CGL) 130 between the blue light emitting unit 120 and the phosphorescent light emitting unit 140. Here, the CGL 130 serves as an electron injection layer for the blue light emitting unit 120 and as a hole injection layer or a hole transport layer for the phosphorescent light emitting unit 140.

Here, the blue light emitting unit 120 includes a blue light emitting layer 126 (with reference to FIG. 3A) having the first light emitting peak P1 at a wavelength of 380 nm to 479 nm, and the phosphorescent light emitting unit 140 includes a phosphorescent light emitting layer 144 (with reference to FIG. 3A) having the second light emitting peak P2 at a wavelength of 480 nm to 780 nm.

The blue light emitting layer is formed by doping a blue dopant in at least one host. The host(s) may include host material having different characteristic. Here, the first light emitting peak P1 of the blue light emitting layer preferably has a wavelength of 430 nm to 460 nm, and the blue dopant doping the at least one host uses a material expressing deep blue. When the white organic light emitting device is implemented as a display device through use of such a dopant, a CIEy coordinate of an sRGB space corresponding to blue after transmission through color filters may have a value of 0.01 to 0.06.

The second light emitting peak P2 of the phosphorescent light emitting layer preferably has a wavelength of 530 nm to 630 nm. That is, the phosphorescent light emitting layer may be formed by doping at least one host with a greenish yellow dopant or by doping at least one host with a yellow dopant.

Further, a trough of the 2-peak white spectrum between the first light emitting peak and the second light emitting peak is preferably at a wavelength of 480 nm to 530 nm.

Through the light emitting layers of the respective light emitting units, each of which is formed by doping at least one host with one dopant, as described above, the white organic light emitting device in accordance with the present invention may have 2 peaks in the white spectrum to execute white display.

As shown in FIG. 2, the maximum peak of the 2-peak white spectrum is generated at a wavelength corresponding to the first light emitting peak P1.

The reason why the first light emitting peak P1 emitting deep blue light has a higher light intensity than the second light emitting peak P2 emitting greenish yellow light or yellow light is to compensate for low internal quantum efficiency generated when the blue light emitting unit including a material emitting deep blue light, which is developed now, is implemented. That is, the reason for this is to implement a uniform white spectrum by combination of the blue light emitting unit having low efficiency and the phosphorescent light emitting unit emitting greenish yellow or yellow light of a remaining broad wavelength band. Therethrough, the white organic light emitting device may have a uniform white spectrum without inclination to a specific color.

According to circumstances, if a deep blue material having improved internal quantum efficiency and lifespan is provided, light intensities of wavelengths at which the first and second light emitting peaks are generated may be adjusted to the same level or similar levels.

The first electrode 110 is formed of a transparent conductive material, such as indium tin oxide (ITO) or indium zinc oxide (IZO).

The second electrode 150 is formed of a reflective metal, such as gold (Au), aluminum (Al), molybdenum (Mo), chrome (Cr), or copper (Cu). Through such a structure, blue light from the blue light emitting unit 120 and greenish yellow light or yellow light from the phosphorescent light emitting unit 140 are mixed through a bottom emission method, thereby producing white light.

According to circumstances, the materials for the first electrode 110 and the second electrode 150 may be interchanged so that a top emission method may be applied.

One of the first electrode 110 and the second electrode 150 serves as an anode, and the other serves as a cathode.

Hereinafter, application of the above-described white organic light emitting device in accordance with the present invention to a display device will be described.

Figure 3A:
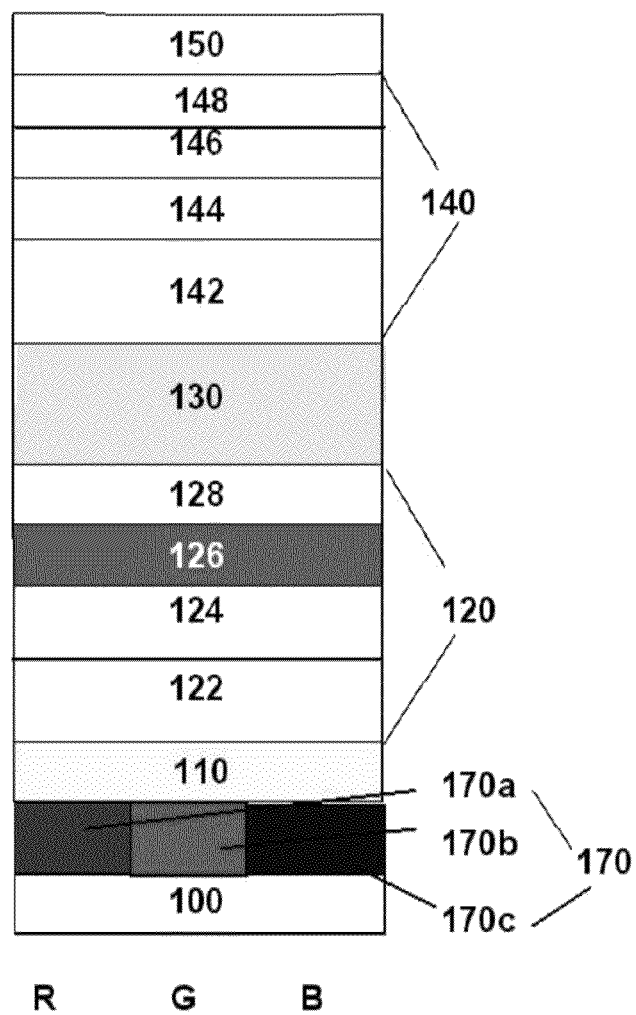
FIGS. 3A and 3B are sectional views illustrating display devices in accordance with embodiments of the present invention to which the white organic light emitting device is applied.
Figure 3B:
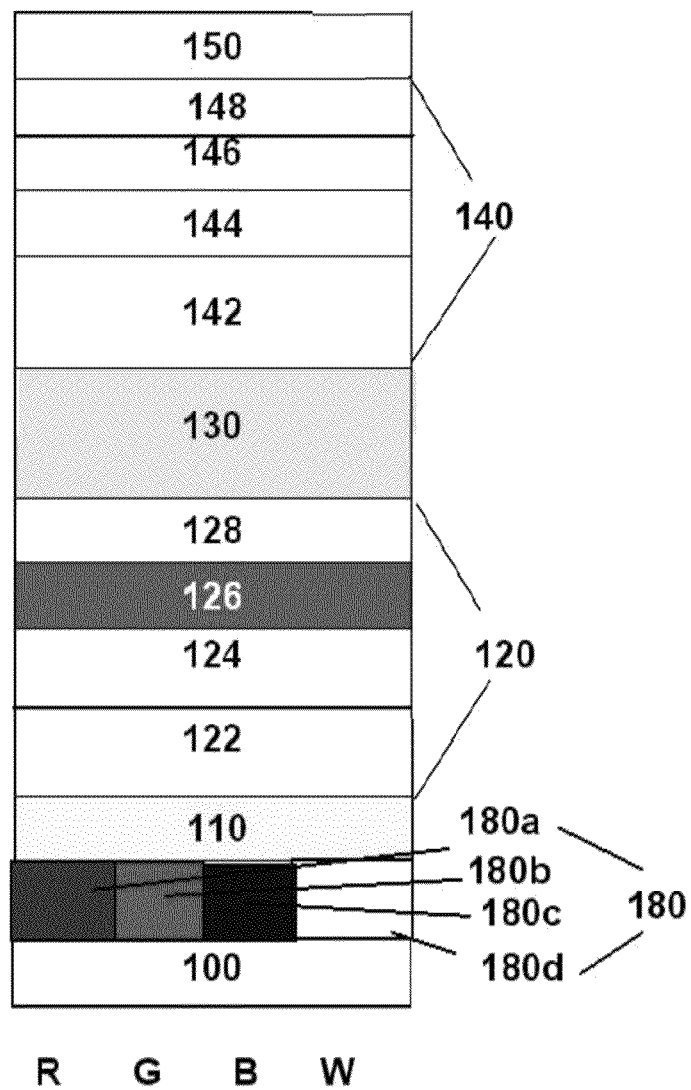

FIGS. 3A and 3B are sectional views illustrating display devices in accordance with embodiments of the present invention to which the white organic light emitting device is applied.

As shown in FIG. 3A, the display device in accordance with a first embodiment of the present invention includes the blue light emitting unit 120 and the phosphorescent light emitting unit 140 of the above-described white organic light emitting device, and further includes a color filter layer 170 formed on the substrate 100.

Here, the blue light emitting unit 120 includes a first hole injection layer 122, a first hole transport layer 124, a blue light emitting layer 126 and a first electron transport layer 128 sequentially formed on the first electrode 110.

Further, the phosphorescent light emitting unit 140 includes a second hole transport layer 142, a phosphorescent light emitting layer 144, a second electron transport layer 146 and a first electron injection layer 148 sequentially formed in the upward direction. The phosphorescent light emitting layer 144 may be formed by doping at least one host with a greenish yellow dopant or by doping at least one host with a yellow dopant, as described above.

The CGL 130 is formed between the blue light emitting unit 120 and the phosphorescent light emitting unit 140 and serves to adjust charge balance between the respective units. For this purpose, a portion of the CGL 130 adjacent to the blue light emitting unit 120 may be formed of an alkali metal or an alkali metal compound serving as an electron injection layer or an organic material or an organic compound serving as an electron injection layer, and a portion of the CGL 130 adjacent to the phosphorescent light emitting unit 140 may be formed of an organic material serving as a hole injection layer. Further, according to circumstances, the CGL 130 may include buffer layer between the lower and upper portions thereof to effectively achieve an electron injection function at the lower portion thereof and a hole injection function at the upper portion thereof.

Preferably, the first hole transport layer 124, the first electron transport layer 128, the second hole transport layer 142 and the second electron transport layer 146 adjacent to the respective light emitting layers 126 and 144 have a higher triplet energy state than the triplet energy state of the respective light emitting layers 126 and 144 by 0.01 eV to 1.0 eV. The reason for this is to confine triplet excitons used in light emission in the respective light emitting layers 126 and 144 and to effectively use the triplet excitons in light emission.

Further, the color filter layer 170 includes color filters 170a, 170b and 170c having different colors corresponding to respective R, G and B sub-pixels into which one pixel of the substrate 100 is divided.

In this case, the color filter layer 170 is located between the substrate 100 and the first electrode 110, and the respective color filters 170a, 170b and 170c transmit light emitted downwardly from the second electrode 150 to the first electrode 110 so that the R, G and B sub-pixels transmit light of corresponding colors.

Here, blue light transmittance of a blue color filter 170c provided on a blue sub-pixel is improved by use of a deep blue dopant in the blue light emitting layer 124, as compared to use of a normal blue dopant. Further, a light distribution of the phosphorescent light emitting layer 144 is present at a long wavelength band by use of a greenish yellow or yellow dopant, and thus the red and green color filters 170a and 170b may transmit red light and green light to emit the red light and the green light. Further, the display device having the two light emitting units has a high light intensity at a wavelength where the second peak is generated, as compared to a red/green light emitting unit having two peaks corresponding to red and green colors, and thus has high luminance and efficiency, as compared to the red/green light emitting unit, thereby reducing power consumption.

The CGL 130 may be omitted, according to circumstances. In this case, the first electron transport layer 128 and the second hole transport layer 142 may exhibit the function of the CGL.

Further, the first hole injection layer 122 and the first hole transport layer 124 may be integrated into one layer, i.e., a first common layer, and the second electron transport layer 128 and the second electron injection layer 148 may be integrated into one layer, i.e., a fourth common layer. In this case, the first electron transport layer 128 serves as a second common layer and the second hole transport layer 142 serves as a third common layer.

As shown in FIG. 3B, the display device in accordance with a second embodiment of the present invention differs from the display device in accordance with the first embodiment in that the display device in accordance with the second embodiment further includes a white sub-pixel on the substrate 100 in addition to the red, green and blue sub-pixels. In this case, one pixel includes R, G, B and W sub-pixels. Here, the color filter layer 180 includes a red color filter 180a, a green color filter 180b and a blue color filter 180b corresponding to the R, G and B sub-pixels, in the same manner as the above-described first embodiment. Preferably, a portion of the color filter layer 180 corresponding to the W sub-pixel is vacant, or is formed of a transparent organic material 180d having a thickness equal or similar to that of the adjacent color filters 180a, 180b and 180c, as shown in FIG. 3B, in order to reduce step coverage of the structure of the white organic light emitting device stacked thereon.

Figure 4:
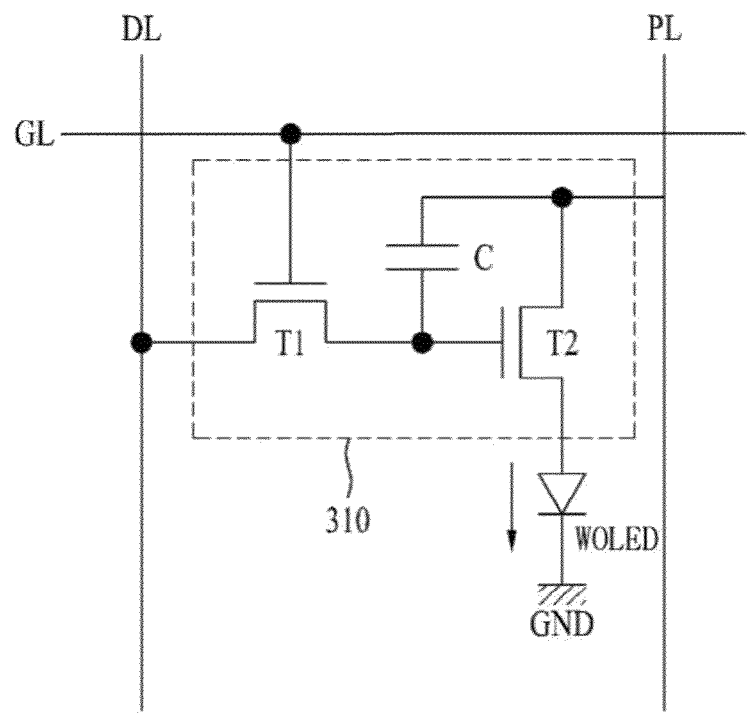
FIG. 4 is a circuit diagram illustrating a circuit of one pixel of the display device in accordance with the present invention.
Figure 5:
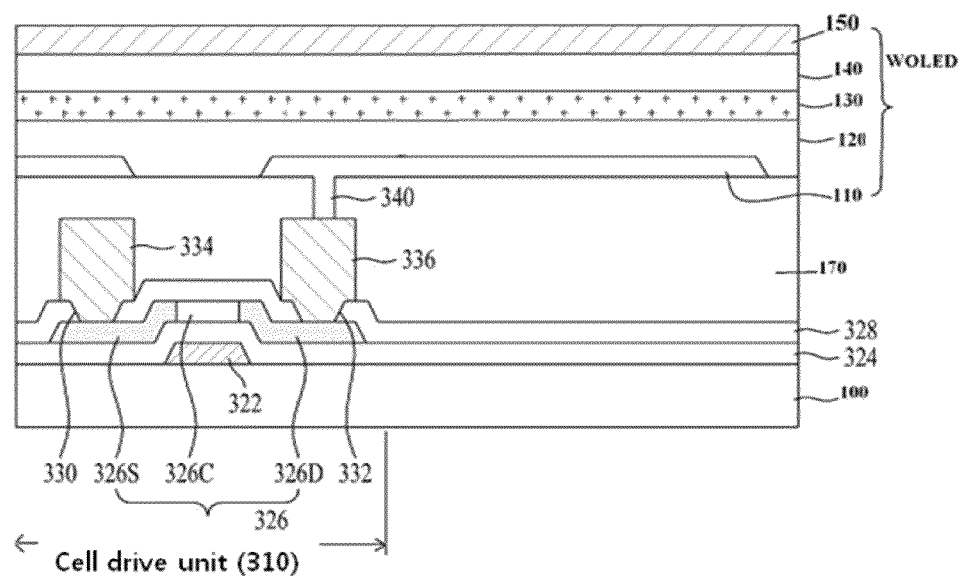
FIG. 5 is a vertical-sectional view of one pixel of the display device in accordance with the present invention.

FIG. 4 is a circuit diagram illustrating a circuit of one pixel of the display device in accordance with the present invention, and FIG. 5 is a vertical-sectional view of one pixel of the display device in accordance with the present invention.

One pixel of the display device in accordance with the present invention includes a cell drive unit 310 connected to a gate line GL, a data line DL and a power line PL, and a white organic light emitting device WOLED connected between the cell drive unit 310 and a ground GND and equivalently expressed as a diode.

The cell drive unit 310 includes a switch thin film transistor T1 connected to the gate line GL and the data line DL, a drive thin film transistor T2 connected to the switch thin film transistor T1, the power line P1 and a first electrode of the white organic light emitting device WOLED, and a storage capacitor C connected between the power line PL and a drain electrode of the switch thin film transistor T1.

A gate electrode of the switch thin film transistor T1 is connected to the gate line GL, a source electrode of the switch thin film transistor T1 is connected to the data line DL, and the drain electrode of the switch thin film transistor T1 is connected to a gate electrode of the drive thin film transistor T2 and the storage capacitor C. A source electrode of the drive thin film transistor T2 is connected to the power line P1, and a drain electrode of the drive thin film transistor T2 is connected to the first electrode 342 of the white organic light emitting device WOLED. The storage capacitor C is connected between the power line PL and the gate electrode of the drive thin film transistor T2.

When a scan pulse is supplied to the gate line GL, the switch thin film transistor T1 is turned on and supplies a data signal supplied to the data line DL to the storage capacitor C and the gate electrode of the drive thin film transistor T2. The drive thin film transistor T2 controls current I supplied from the power line P1 to the white organic light emitting device WOLED in response to the data signal supplied to the gate electrode of the drive thin film transistor T2, thereby adjusting an amount of light emitted from the white organic light emitting device WOLED. Further, although the switch thin film transistor T1 is turned off, the drive thin film transistor T2 supplies regular current T by means of voltage charged in the storage capacitor C until a data signal of the next frame is supplied, thereby maintaining a light emitting state of the white organic light emitting device WOLED.

The drive thin film transistor T2 includes, as shown in FIG. 5, a gate electrode 322 formed on an insulating substrate 100, a gate insulating film 324 covering the gate electrode 322, a semiconductor layer 326 formed on the gate insulating film 324, an interlayer insulating film 328 covering the semiconductor layer 326, and a source electrode 334 and a drain electrode 336 respectively connected to a source region 326S and a drain region 326D of the semiconductor layer 326 through first and second contact holes 330 and 332 passing through the interlayer insulating film 328. The semiconductor layer 326 is formed of an LTPS thin film, and includes a channel region 326C overlapping with the gate electrode 322, and the source region 326S and the drain region 326D which are located at both sides of the channel region 326C and do not overlap with the gate electrode 322 and into which impurities are injected.

Although the present invention exemplarily illustrates the semiconductor layer 326 as being formed of the LTPS thin film, the semiconductor layer 326 is not limited thereto.

The white organic light emitting device WOLED includes the first electrode 110, the blue light emitting unit 120 including the blue light emitting layer, the CGL 130, the phosphorescent light emitting unit 140 and the second electrode 150, which are sequentially formed over the whole surface of the color filter layer 170 evenly covering the cell drive unit 310, such as the drive thin film transistor T2, without a mask.

Hereinafter, efficiency and optical characteristics of the white organic light emitting device and the display device using the same in accordance with the present invention will be described with reference to tables below and the accompanying drawings.

Figure 6:
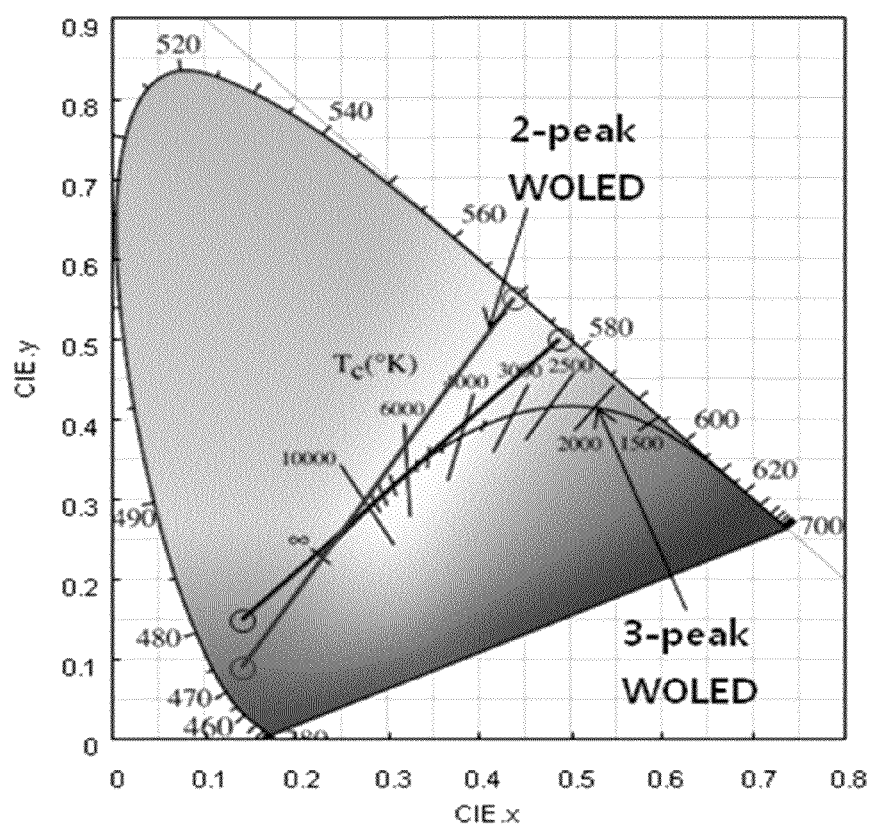
FIG. 6 is a graph illustrating CIE color coordinate systems of the white organic light emitting device in accordance with the present invention and a 3-peak white organic light emitting device for comparison therewith.

FIG. 6 is a graph illustrating CIE color coordinate systems of the white organic light emitting device in accordance with the present invention and a 3-peak white organic light emitting device for comparison therewith.

In order to satisfy white display required by the display device, it is necessary to follow a Kelvin curve of a CIE coordinate system representing a color temperature of more than 10,000K and an sRGB space.

The white organic light emitting device in accordance with the present invention is configured such that the peak of the blue light emitting layer is generated at a deep blue region in consideration of the fact that blue light transmittance of a blue color filter satisfying the sRGB space is greatly lowered, when the peak of the blue light emitting layer is inclined to a long wavelength, and thus power consumption is increased.

As seen from the lower end of the left of the graph of FIG. 6 corresponding to blue, it may be understood that the 2-peak white organic light emitting device in accordance with the present invention emits blue light at a lower wavelength band than the 3-peak white organic light emitting device. It may be expected that the graph is lowered, as the maximum light emitting peak of the blue dopant of the blue light emitting layer is lowered. The white organic light emitting device in accordance with the present invention is configured to adjust the light emitting peak of the blue light emitting layer so that a blue CIEy color coordinate of the sRGB space has a value of less than 0.06.

Further, as shown in FIG. 6, the white organic light emitting device of the present invention has the CIE coordinate system close to the Kelvin curve under the condition of a color temperature of more than 1000K required by the display device, thus achieving a reduction in power consumption.

Further, the white organic light emitting device of the present invention uses the yellow dopant or the greenish yellow dopant distributed at a broad wavelength region of the spectrum, thereby allowing the phosphorescent light emitting layer to emit both red light and green light after transmission through the color filters. In this case, the phosphorescent light emitting layer uses one dopant and thus facilitates reproductive peak implementation, and particularly, has a second light emitting peak in a range similar to 555 nm at which the maximum value is generated in the luminosity curve and thus has high luminous efficiency. Therethrough, a light intensity of more than a designated level at a long wavelength region band is obtained, and thus luminous efficiency of more than a designated level when red light and green light pass through the color filter layer is expected.

Figure 7:
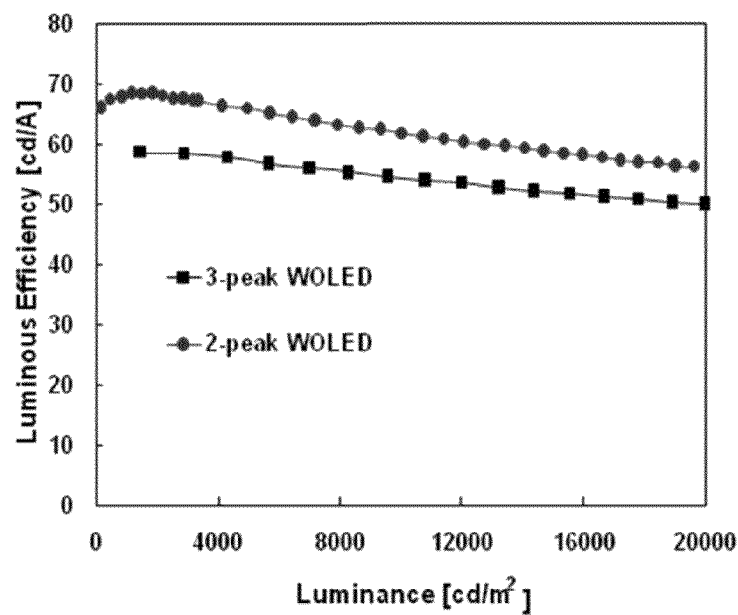
FIG. 7 is a graph illustrating luminous efficiencies of the white organic light emitting device in accordance with the present invention and the 3-peak white organic light emitting device compared therewith according to luminance.

FIG. 7 is a graph illustrating luminous efficiencies of the white organic light emitting device in accordance with the present invention and the 3-peak white organic light emitting device compared therewith according to luminance.

As shown in FIG. 7, through comparison between the 3-peak white organic light emitting device having a white spectrum in which peaks are respectively generated at R, G and B regions and the white organic light emitting device having the 2-peak white spectrum in accordance with the present invention, it is understood that luminous efficiency of the 2-peak white spectrum in accordance with the present invention is higher than that of the 3-peak white spectrum at any luminance.

Further, as stated in Table 1 below, through comparison between the 3-peak white organic light emitting device having the white spectrum in which peaks are respectively generated at R, G and B regions and the white organic light emitting device having the 2-peak white spectrum in accordance with the present invention, it may be understood that luminance (Cd/A) and luminous efficiency (1 m/W) of the 2-peak white organic light emitting device in accordance with the present invention are more excellent than those of the 3-peak white organic light emitting device.

Table 1 states values of a result of a test in which current condition is set to 10 mA/cm$^2$.

TABLE 1

|  | Blue light emitting layer | Phosphorescent light emitting layer | Cd/A | 1 m/W | CIEx | CIEy |
|---|---|---|---|---|---|---|
| 3-peak WOLED | Normal blue | R + G | 56.6 | 23.8 | 0.341 | 0.323 |
| 2-peak WOLED | Deep blue | YG | 64.1 | 26.9 | 0.320 | 0.341 |

Figure 8:
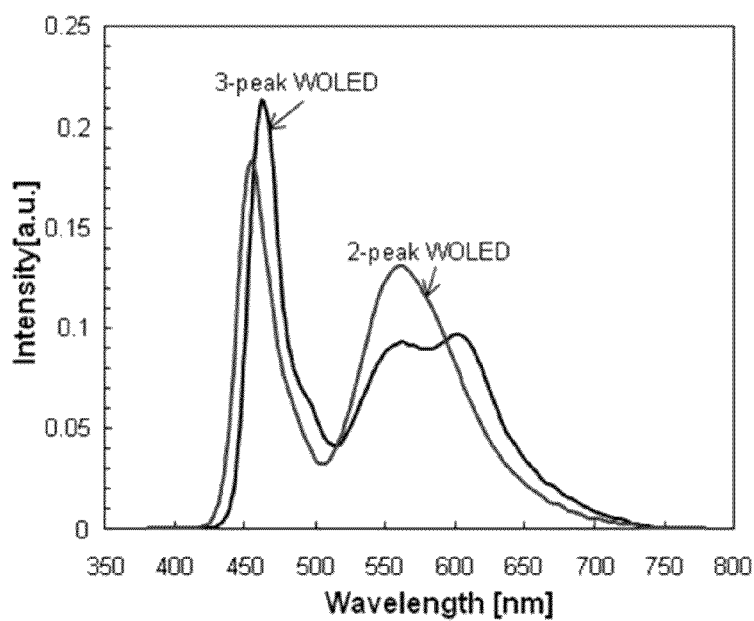
FIG. 8 is a graph illustrating light intensities of the white organic light emitting device in accordance with the present invention and the 3-peak white organic light emitting device compared therewith according to wavelength.

FIG. 8 is a graph illustrating light intensities of the white organic light emitting device in accordance with the present invention and the 3-peak white organic light emitting device compared therewith according to wavelength.

As shown in FIG. 8, it is understood that the white organic light emitting device having the 2-peak white spectrum in accordance with the present invention has a first light emitting peak at a deep blue region and a second light emitting peak at a yellow or greenish yellow region, as compared to the 3-peak white organic light emitting device having the white spectrum in which peaks are respectively generated at R, G and B regions. Here, the light intensity at the first light emitting peak of the white organic light emitting device in accordance with the present invention is slightly lower than the blue light emitting peak of the 3-peak white organic light emitting device, and the light intensity at the second light emitting peak of the white organic light emitting device in accordance with the present invention is higher than the remaining light emitting peaks of the 3-peak white organic light emitting device. These light intensities represent increase of relative light intensities of materials having relatively low efficiencies from among materials for the light emitting layer which are recently developed, and may be adjusted to similar values or opposite values through development of materials.

Hereinafter, the white organic light emitting device (3-peak WOLED) having the 3-peak white spectrum and the white organic light emitting device (2-peak WOLED) having the 2-peak white spectrum when they are actually applied to the display device will be compared to each other.

TABLE 2

|  | R | G | B | W |
|---|---|---|---|---|
| CIEx | 0.675 | 0.260 | 0.132 | 0.285 |
| CIEy | 0.323 | 0.653 | 0.064 | 0.298 |
| Y transmittance | 0.136 | 0.273 | 0.045 | 1.000 |
| Cd/A | 8.31 | 16.66 | 2.77 | 61.00 |

TABLE 3

|  | R | G | B | W |
|---|---|---|---|---|
| CIEx | 0.665 | 0.280 | 0.145 | 0.320 |
| CIEy | 0.329 | 0.662 | 0.058 | 0.340 |
| Y transmittance | 0.081 | 0.410 | 0.049 | 1.000 |
| Cd/A | 5.20 | 26.26 | 3.14 | 64.06 |

Tables 2 and 3 represent the CIE coordinate systems of the 3-peak white organic light emitting device and the 2-peak white organic light emitting device in accordance with the present invention after transmission through the color filters when the 3-peak white organic light emitting device and the 2-peak white organic light emitting device are applied to the display device.

Here, in terms of y color coordinates of blue light, when the 2-peak white organic light emitting device in accordance with the present invention is applied to the display device, CIEy has a value of 0.058 and thus satisfies the condition of the sRGB space, i.e., less than 0.06, and has luminance and transmittance of the color filter layer which are slightly higher than those of the 3-peak white organic light emitting device, and thus a reduction in power consumption may be expected.

Hereinafter, the 3-peak white organic light emitting device and the 2-peak white organic light emitting device which are actually applied to the display device are compared to each other in terms of luminance, current, current density and current ratio related thereto, drive voltage and power consumption.

TABLE 4

|  | R | G | B | W | Total |
|---|---|---|---|---|---|
| Efficiency(Cd/A) after transmission through color filter | 8.3 | 16.7 | 2.8 | 61.0 |  |
| Panel luminance(Cd/m$^2$) | 2.0 | 13.1 | 2.9 | 35.0 | 53.0 |
| Panel current(A) | 0.47 | 1.56 | 2.11 | 1.14 | 5.29 |
| Current density(mA/cm$^2$) | 0.45 | 1.50 | 2.03 | 1.09 | 5.07 |
| Current ratio | 0.22 | 0.74 | 1.00 | 0.54 |  |
| Vdd(V) |  |  | 23 |  |  |
| Power consumption(W) |  |  | 121.6 |  |  |

TABLE 5

|  | R | G | B | W | Total |
|---|---|---|---|---|---|
| Efficiency(Cd/A) after transmission through color filter | 5.2 | 26.3 | 3.0 | 64.0 |  |
| Panel luminance(Cd/m$^2$) | 2.2 | 9.5 | 2.4 | 38.9 | 53.0 |
| Panel current(A) | 0.81 | 0.71 | 1.55 | 1.20 | 4.28 |
| Current density(mA/cm$^2$) | 0.77 | 0.68 | 1.48 | 1.15 | 4.09 |
| Current ratio | 0.52 | 0.46 | 1.00 | 0.78 |  |
| Vdd(V) |  |  | 23 |  |  |
| Power consumption(W) |  |  | 98.2 |  |  |

Test values of Tables 4 and 5 above are values when a standard moving image is displayed at a color temperature of 1000K using a 55 inch RGBW panel, and it is confirmed that when the 2-peak white organic light emitting device in accordance with the present invention is used, power consumption is reduced by more than 20%. Therefore, it is understood that the display device to which the 2-peak white organic light emitting device in accordance with the present invention is applied has excellent efficiency as compared to the display device to which the 3-peak white organic light emitting device is applied.

In order to improve the feeling of color and to increase a lifespan of the display device during viewing white display, the display device requires emission of bluish white light. For this purpose, the y color coordinate of blue in the sRGB color coordinate system should have a value of less than 0.06, and it is difficult to produce such a value using a normal blue (sky blue) dopant generally used in the blue light emitting layer. Even in case in which the normal blue dopant is used, the level of the color coordinate may be set using a blue color filter applied to transmittance thereof. However, in this case, a blue spectrum is inclined to a long wavelength, and thus transmittance at the blue color filter satisfying the sRGB is greatly lowered and power consumption is inevitably increased.

The display device employing the 2-peak white organic light emitting device in accordance with the present invention allows the maximum peak of the blue light emitting layer to be formed at a region of 430 nm to 460 nm using a blue dopant formed of a material emitting deep blue light, thereby achieving a reduction in power consumption and preventing lowering of blue light transmittance, simultaneously.

The above-described white organic light emitting device and display device using the same in accordance with the present invention have effects, as follows.

The blue light emitting unit includes the blue light emitting layer including at least one host and a deep blue dopant and the phosphorescent light emitting unit stacked on the blue light emitting unit includes at least one host and a yellow or greenish yellow dopant, thereby being capable of implementing a reproductive white organic light emitting device.

Further, when the color filters transmits light, transmittance of blue light of a short wavelength band is improved, and thus power consumption may be reduced. Moreover, a color coordinate at a blue wavelength significant in the display device has a value of less than 0.06, and thus the feeling of color may be improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A white organic light emitting device comprising:
a first electrode and a second electrode disposed opposite each other on a substrate, and a blue light emitting unit and a phosphorescent light emitting unit provided between the first electrode and the second electrode,
wherein a white spectrum of the white organic light emitting unit has only 2 peaks and the 2-peaked white spectrum is formed through a first light emitting peak of the blue light emitting unit at a wavelength of 430 nm to 460 nm and a second light emitting peak of the phosphorescent light emitting unit at a wavelength of 530 nm to 630 nm such that a value of a CIEy color coordinate of blue light after transmission through a color filter via the blue light emitting unit and the phosphorescent light emitting unit is less than or equal to 0.06,
wherein the maximum peak of the 2-peak white spectrum is generated at a wavelength corresponding to the first light emitting peak, and
wherein a trough of the 2-peak white spectrum between the first light emitting peak and the second light emitting peak is at a wavelength of 480 nm to 530 nm.

2. The white organic light emitting unit according to claim 1, wherein the blue light emitting unit includes a blue light emitting layer formed by doping at least one host with a blue dopant.

3. The white organic light emitting unit according to claim 1, wherein the phosphorescent light emitting unit includes a phosphorescent light emitting layer formed by doping at least one host with a greenish yellow dopant.

4. The white organic light emitting unit according to claim 1, wherein the phosphorescent light emitting unit includes a phosphorescent light emitting layer formed by doping at least one host with a yellow dopant.

5. The white organic light emitting unit according to claim 1, further comprising a charge generation layer provided between the blue light emitting unit and the phosphorescent light emitting unit.

6. The white organic light emitting unit according to claim 1, further comprising first to third common layers sequentially provided between the first electrode and the blue light emitting unit, between the blue light emitting unit and the phosphorescent light emitting unit, and between the phosphorescent light emitting unit and the second electrode.

7. A display device comprising:
a substrate on which a cell drive unit is formed;
a color filter layer provided on the substrate;
a first electrode connected to the cell drive unit;
a second electrode disposed opposite to the first electrode;
a charge generation layer provided between the first electrode and the second electrode;
a blue light emitting unit provided between the first electrode and the charge generation layer and having a first light emitting peak at a wavelength of 430 nm to 460 nm; and
a phosphorescent light emitting unit provided between the charge generation layer and the second electrode and having a second light emitting peak at a wavelength of 530 nm to 630 nm,
wherein a white spectrum of the display device has only 2 peaks and the maximum peak of the 2-peaked white spectrum is generated at a wavelength corresponding to the first light emitting peak,
wherein a trough of the 2-peak white spectrum between the first light emitting peak and the second light emitting peak is at a wavelength of 480 nm to 530 nm, and
wherein a value of a CIEy color coordinate of blue light after transmission through the color filter layer via the phosphorescent light emitting unit and the blue light emitting unit is less than or equal to 0.06.

8. The display device according to claim 7, wherein the blue light emitting unit includes a blue light emitting layer formed by doping at least one host with a blue dopant.

9. The display device according to claim 7, wherein the value of the CIEy color coordinate of the blue light after transmission through the color filter layer via the phosphorescent light emitting unit and the blue light emitting unit is in the range of 0.01 to 0.06.

10. The display device according to claim 7, wherein the phosphorescent light emitting unit includes a phosphorescent light emitting layer formed by doping at least one host with a greenish yellow dopant.

11. The display device according to claim 7, wherein the phosphorescent light emitting unit includes a phosphorescent light emitting layer formed by doping at least one host with a yellow dopant.

12. The display device according to claim 7, wherein the maximum peak of a 2-peak white spectrum having the first light emitting peak and the second light emitting peak is generated at a wavelength corresponding to the first light emitting peak.

13. The display device according to claim 7, further comprising first to fourth common layers sequentially provided between the first electrode and the blue light emitting unit, between the blue light emitting unit and the charge generation layer, between the charge generation layer and the phosphorescent light emitting unit, and between the phosphorescent light emitting unit and the second electrode.

14. The display device according to claim 7, wherein the substrate includes a red sub-pixel, a green sub-pixel and a blue sub-pixel provided at different regions, and the color filter layer includes a red color filter layer, a green color filter layer and a blue color filter layer corresponding to the respective sub-pixels.

15. The display device according to claim 7, wherein the substrate includes a red sub-pixel, a green sub-pixel, a blue sub-pixel and a white sub-pixel provided at different regions, and the color filter layer includes a red color filter layer, a green color filter layer and a blue color filter layer corresponding to the respective sub-pixels.

* * * * *